United States Patent [19]
Alderton

[11] Patent Number: 6,034,573
[45] Date of Patent: Mar. 7, 2000

[54] METHOD AND APPARATUS FOR CALIBRATING MODULATION SENSITIVITY

[75] Inventor: Martin Alderton, San Diego, Calif.

[73] Assignee: Uniden San Diego Research & Development Center, Inc., San Diego, Calif.

[21] Appl. No.: 08/961,400

[22] Filed: Oct. 30, 1997

[51] Int. Cl.[7] .................................................. H03C 3/08
[52] U.S. Cl. .......................... 332/125; 332/124; 332/123; 455/44; 455/232.1; 455/254; 455/75; 375/345
[58] Field of Search ..................................... 375/200, 345; 332/106, 107, 125, 123, 124, 126; 455/75, 44, 232.1, 234.1, 249.1, 254

[56] References Cited

U.S. PATENT DOCUMENTS 5,832,022  11/1998  Scott ........................................ 375/200

*Primary Examiner*—Arnold Kinkead
*Attorney, Agent, or Firm*—Heller Ehrman White & McAuliffe

[57] ABSTRACT

A method and apparatus for continuously calibrating the modulation sensitivity of a voltage controlled oscillator (VCO) within a modulator of a transmitter. In accordance with the present invention, the transmitter is coupled to the receiver in order to loop back the transmit signal. The present invention includes a baseband signal generator which generates a reference baseband signal of known amplitude during periods when no other baseband information is being applied to the transmitter by the user. A Signal and Reference Comparison Circuit (SRCC) receives the output from the demodulator and determines whether the VCO within the transmitter has the proper modulation sensitivity. If the modulation sensitivity of the VCO is not within a desired range, then a signal generated by the SRCC is applied to a baseband level control circuit to adjust the level of the baseband signal that is applied to the VCO.

7 Claims, 8 Drawing Sheets

$d_I(t) \cos (\pi t/2T)$ $d_I(t) \cos (\pi t/2T) \cos \omega_0 t$ $d_Q(t) \sin (\pi t/2T)$ $d_Q(t) \sin(\pi t/2T) \sin \omega_0 t$ $s(t)$

METHOD AND APPARATUS FOR CALIBRATING MODULATION SENSITIVITY

BACKGROUND OF THE INVENTION

1. Field of the Invention

This invention relates to modulators for modulating electrical signals, and more particularly to a method and apparatus for calibrating the modulation sensitivity of a modulator by providing a feedback path between a transmitter and receiver and adjusting the modulation sensitivity in response to the transmitter output as detected by the receiver.

2. Description of Related Art

Encoding, or "modulating", information on an electrical signal is an important part of the communication arts. Whether signals are to be transmitted over the air or through a conduit (such as wire or fiber optic cable), the particular manner in which information is modulated impacts the cost and reliability of the system, and is critical in determining the amount of, and the speed at which, such information can be transmitted. Because of limitations in the frequency spectrum that is available for use in transmitting information, it is typically desirable to use as little of the frequency spectrum as possible to transmit information (i.e., increase system bandwidth efficiency). In addition to the desire to use the frequency spectrum efficiently, some systems also require a constant envelope modulation. Constant envelope modulation means that the instantaneous signal power does not fluctuate. Constant envelope modulation is desirable because some devices through which the signal must be processed, such as power amplifiers, have highly nonlinear characteristics which, when passing a signal with power fluctuations, cause distortions of the signal which produce extraneous sidebands. These distortions are normally known as AM-to-PM conversion and intermodulation distortion. Generation of such sidebands defuse the power of the information signals (i.e., reduce the amount of power in the band of interest), and also can interfere with nearby channels (adjacent channel interference) or with other communications systems (co-channel interference). Therefore, it is desirable to provide a modulation technique that maintains an essentially constant amplitude envelope.

Modulation techniques, such as Minimum Shift Keying (MSK), strive to minimize the required bandwidth and have constant envelope modulation. This can be understood as follows. Offset quadrature phase shift keying (OQPSK) is a variation on quadrature phase shift keying (QPSK). FIGS. 1a–1c illustrate the way in which information is modulated in accordance with QPSK. Each bit of information is transmitted over a period T. Accordingly, a data stream $d_k(t)$ is defined which has a value associated with each bit of information at each time t. In the case shown in FIG. 1a, the value of $d_k(t)$ is either +1 or −1. The data signal is divided into an in-phase and quadrature data stream, $d_I(t)$ and $d_Q(t)$. The in-phase data stream $d_I(t)$ comprises all of the even numbered data bits $d_0, d_2, d_4$, etc., as shown in FIG. 1b and the quadrature data stream comprises all of the odd numbered data bits, $d_1, d_3, d_5$, etc., as shown in FIG. 1c. Referring to FIG. 2, the in-phase data stream $d_I(t)$ is applied to a first mixer 201 within a modulator 200, and the quadrature data stream $d_Q(t)$ is applied to a second mixer 202. The mixers 201, 202 modulate an in-phase carrier signal of the ½ form $1/(2)^{1/2} \cos(\omega_0 t + \pi/4)$ and a quadrature carrier signal of the form $1/(2)^{1/2} \sin(\omega_0 t + \pi/4)$ with the data signals $d_I(t), d_Q(t)$ and a summing circuit 203 sums the output from the two mixers 201, 202.

In accordance with OQPSK, the data stream is similarly divided into an in-phase data stream and a quadrature data stream. However, the in-phase and quadrature data streams are offset by one period T as shown in FIG. 1d. Since each data bit within the in-phase and quadrature data streams are maintained for a period of 2T, the in-phase and quadrature signals will never transition at the same time. Accordingly, the resulting sum of the in-phase and quadrature signals will never have more than a 90 degree phase shift at any one time. Therefore, when an OQPSK signal undergoes bandlimiting, the resulting intersymbol interference causes the envelope to droop slightly in the region of the +/−90 degrees phase transition, but since the phase transitions of 180 degrees have been avoided in OQPSK, the envelope will not go to zero as it does with QPSK. When the bandlimited OQPSK goes through a nonlinear transponder, the envelope droop is removed; however, the high-frequency components associated with the collapse of the envelope are not reinforced. Thus, out-of-band interference is avoided.

In accordance with MSK modulation, the problem of phase transitions is avoided completely by modulating a OQPSK signal with a sinusoid having a period of $\pi t/2T$, as shown in FIGS. 3(a) and 3(c). This results in the signal shown in FIGS. 3(b) and 3(d). The sum is a signal that has a constant amplitude envelope as shown in FIG. 3(e). Accordingly, MSK modulation can be considered a variation on frequency shift keying (FSK) modulation in which information is encoded by altering the frequency of the carrier between a first and second frequency with a modulation index of 0.5.

However, a problem arises due to the way in which most modulators modulate MSK signals. That is, signals are modulated by applying a baseband information signal directly to a voltage controlled oscillator (VCO). The applied voltage alters the output frequency of the VCO (i.e., the carrier) by an amount that is directly proportional to the applied voltage. In accordance with MSK modulation, the modulation index must be very precisely controlled at 0.5 in order to achieve a deviation frequency of $f_0 +/- 1/4T$. Any variation from this deviation frequency will distort the orthogonal relationship between the in-phase and quadrature signals. Accordingly, the modulation sensitivity (i.e., the amount of deviation in frequency which occurs as a result of the application of a signal of a particular voltage level) is critical.

This creates a practical problem, since VCO modulation sensitivity tends to vary significantly from unit to unit and over temperature. This variation of the VCO modulation sensitivity results in a variation in the modulation index. Thus, if precise control of the modulation index is required, implementation difficulties arise.

Typically, modulators are calibrated during alignment of the transmitter. That is, once the transmitter has been assembled, a known voltage is applied to the VCO within the modulator.

The resulting deviation from the carrier frequency is then adjusted to ensure that the input signal results in the proper frequency deviation. One method for adjusting the deviation of the modulator is to apply the baseband signal to a signal attenuator (or amplifier) that has an adjustable loss (or gain). The loss (or gain) is adjusted to cause a baseband signal of known amplitude to deviate the carrier by the desired amount. Nonetheless, because the modulation sensitivity can change after the transmitter has been aligned, the modulation index can vary during operation and may be more or less than the required 0.5 modulation index.

Accordingly, there is currently a need for a method and apparatus that allows a modulator within a transmitter to be calibrated during the operation of the transmitter to ensure that the modulation index of a VCO remains calibrated during the operation of the modulator regardless of variations in the temperature of the modulator or other modulator operating conditions.

SUMMARY OF THE INVENTION

The present invention is a method and apparatus for continuously calibrating the modulation sensitivity of a voltage controlled oscillator (VCO) within a modulator of a transmitter during the operation of the transmitter. In accordance with the present invention, the transmitter is coupled to the receiver in order to loop back the transmit signal. The present invention includes a baseband signal generator which generates a reference baseband signal of known amplitude during periods when no baseband information is being applied to the transmitter by the user. A Signal and Reference Comparison Circuit (SRCC) receives the output from the demodulator and determines whether the VCO within the transmitter has the proper modulation sensitivity. If the modulation sensitivity of the VCO is not within a desired range, then a signal generated by the SRCC is applied to a baseband signal attenuator (or amplifier) to adjust the level of the baseband signal that is applied to the VCO.

In accordance with one embodiment of the present invention, a direct digital synthesizer (DDS) is formed by a digital-to-analog converter (DAC) which is coupled to a read only memory (ROM) lookup table. The ROM lookup table applies digital values to the DAC to cause the DAC to generate a signal that approximates a sinewave. The values output from the ROM lookup table are selected by a phase accumulator which generates the addresses for the ROM lookup table in increments that are determined by a phase increment value applied to the phase accumulator. The output from the DDS is applied to a transmit VCO. The voltage, in volts, multiplied by the actual transmit oscillator sensitivity, in kHz/Volt, determines the actual peak-to-peak deviation of the transmitter.

In accordance with one embodiment of the present invention, a divide-by-two circuit divides the frequency output from the transmitter by two and couples the divided output to the receiver. The divide-by-two circuit is controllable to allow the transmit signal to pass or to be blocked. The divide-by-two circuit passes the transmit signal during periods when calibration is to take place. During calibration, the receiver demodulates the divided transmitter signal to attain the baseband signal. The resulting voltage of the baseband signal is measured by an analog-to-digital converter (ADC). A digital envelope detector determines the range (i.e., the difference between the maximum and minimum voltage) of the baseband signal. The range is multiplied by two to account for the divide-by-two circuit. The resulting voltage is compared with the peak-to-peak voltage that was used to modulate the transmit signal. The ratio of the resulting voltage and the peak-to-peak voltage provides a correction factor to be applied to the DAC to correct the DAC output such that the resulting DAC error cancels out the transmit oscillator sensitivity error. Calibration is performed at selected times during normal operation when no signal is to be transmitted or received.

In addition, in accordance with one embodiment of the present invention, a test signal can be provided at a frequency that is outside the desired received signal band such that the desired receive signals and test signals can be separated. Thus, by providing filters at the test signal frequency, the test signal can be transmitted during normal operation of the system (i.e., while receiving data).

BRIEF DESCRIPTION OF THE DRAWINGS

The objects, advantages, and features of this invention will become readily apparent in view of the following description, when read in conjunction with the accompanying drawings, in which.

Like reference numbers and designations in the various drawings refer to like elements.

DESCRIPTION OF THE PREFERRED EMBODIMENTS

Throughout this description, the preferred embodiments should be considered as exemplars, rather than limitations on the present invention.

Overview

The preferred embodiment of the present invention is a method and apparatus for calibrating the modulation sensitivity of a transmitter during the operation of the transmitter/receiver.

Figure 1A:
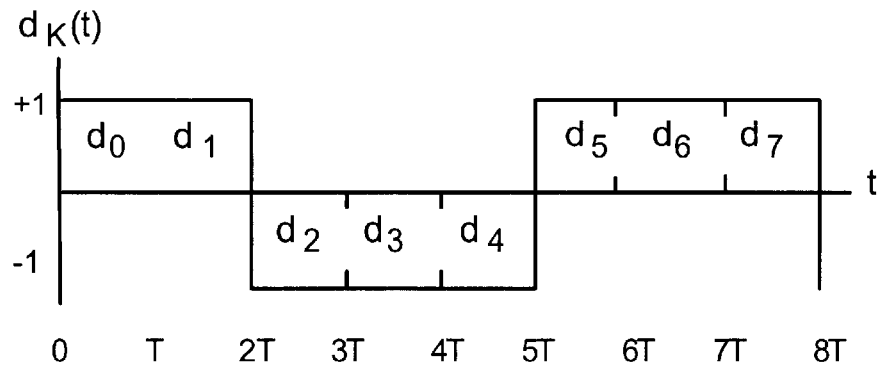
FIG. 1a is an illustration of a data stream $d_K(t)$ which has a value associated with each bit of information at each time t.
Figure 1B:
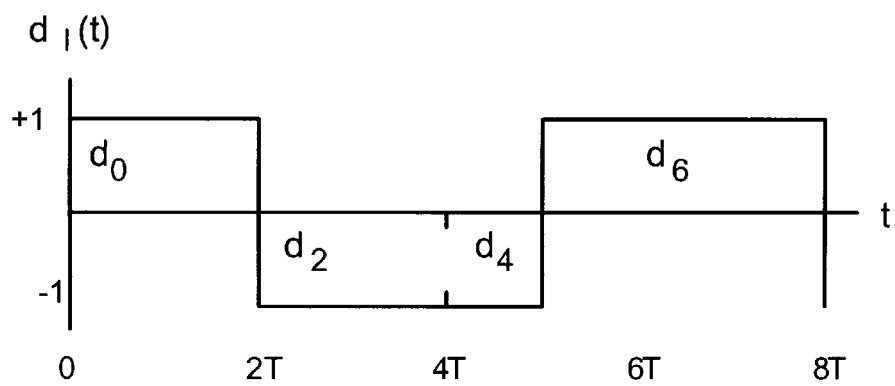
FIG. 1b is an illustration of an in-phase data stream $d_I(t)$ which comprises all of the even numbered data bits $d_0$, $d_2$, $d_4$, etc.
Figure 1C:
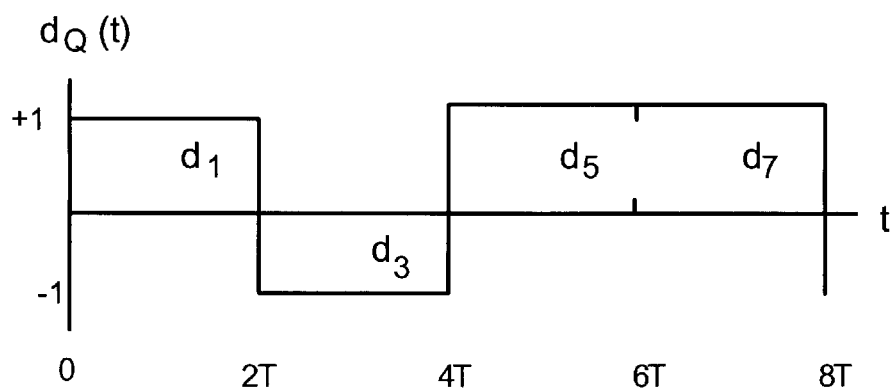
FIG. 1c is an illustration of a quadrature data stream $d_Q(t)$ which comprises all of the odd numbered data bits, $d_1$, $d_3$, $d_5$, etc.
Figure 1D:
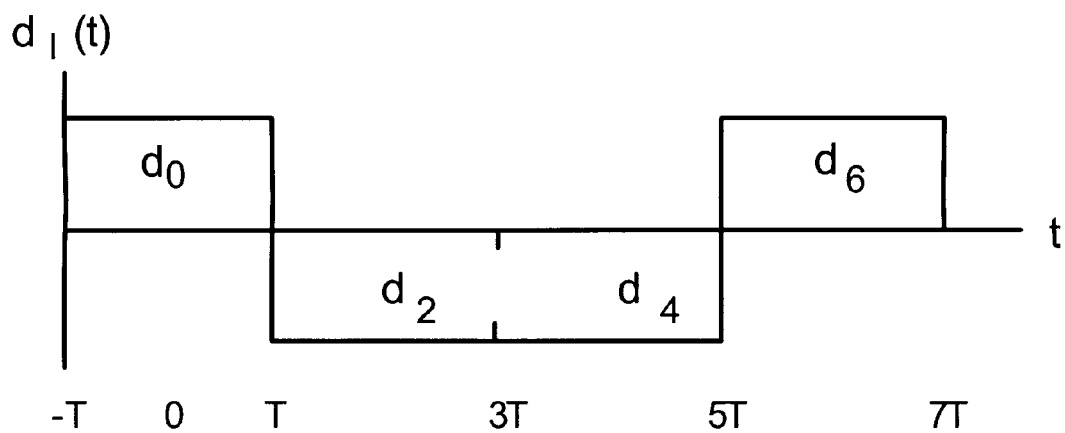
FIG. 1d is an illustration of the in-phase and quadrature data streams offset by one period T in accordance with an offset quadrature phase shift keying technique.
Figure 1D:
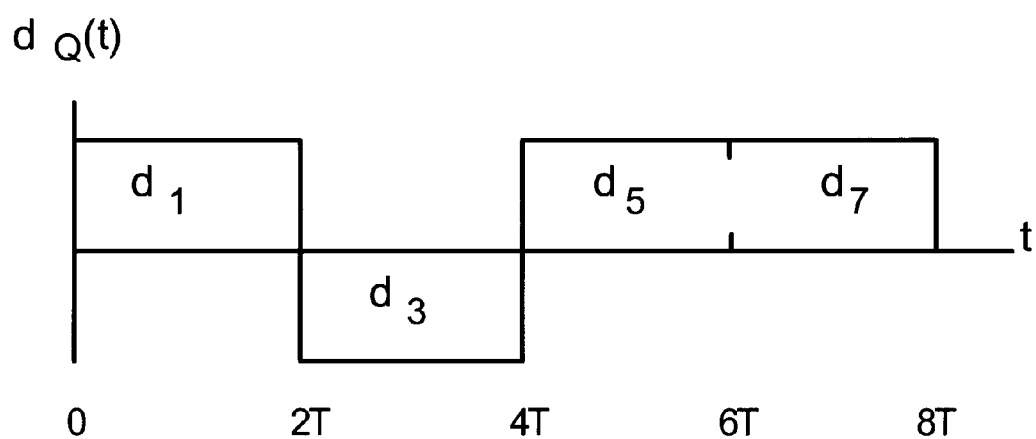
Figure 2:
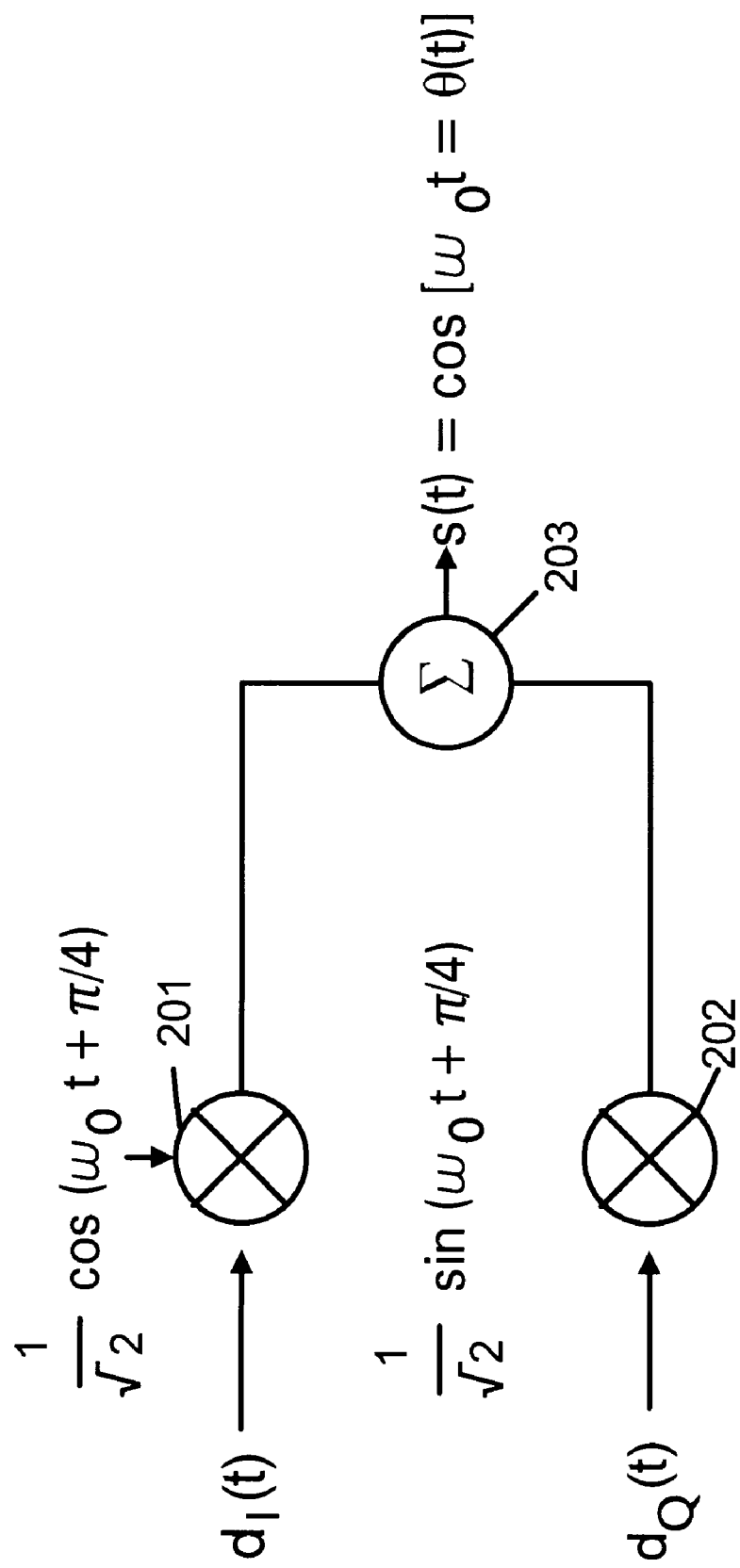
FIG. 2 is a simplified electrical schematic of a prior art quadrature modulator.
Figure 3A:
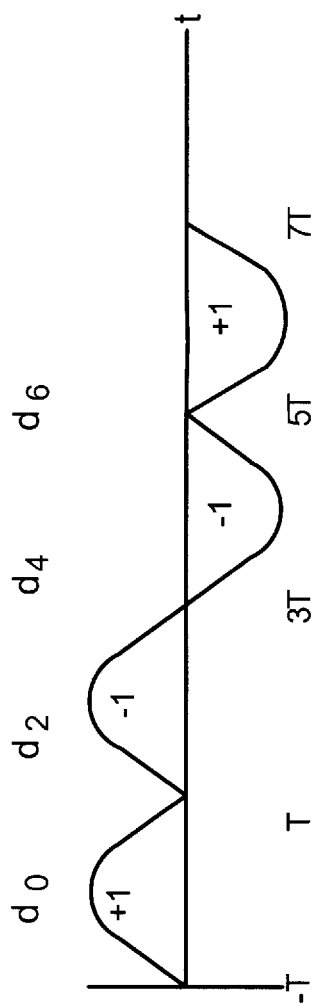
FIGS. 3a and 3c represent the waveform of an in-phase and quadrature offset quadrature phase shift keying modulation baseband signal.
Figure 3B:
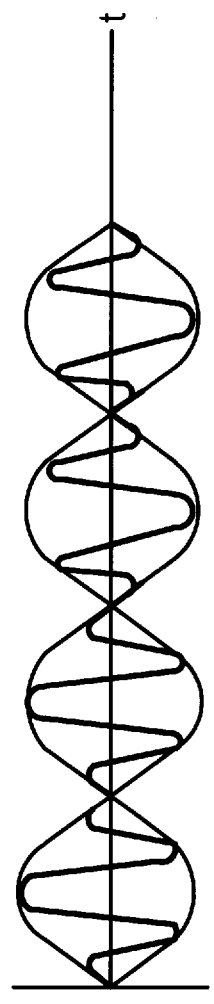
FIGS. 3b and 3d represent the waveforms of FIGS. 3a and 3c modulated with a sinusoidal signal.
Figure 3C:
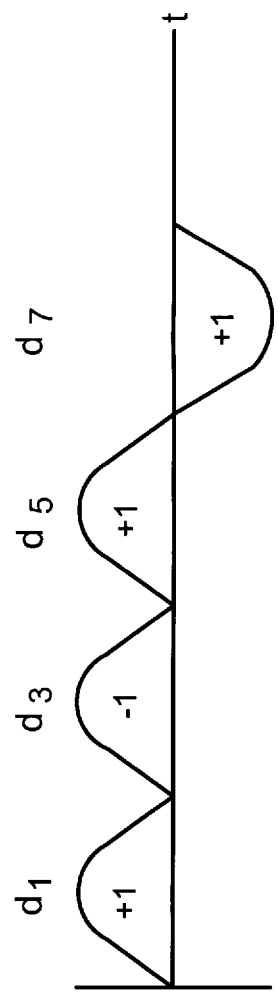
Figure 3D:
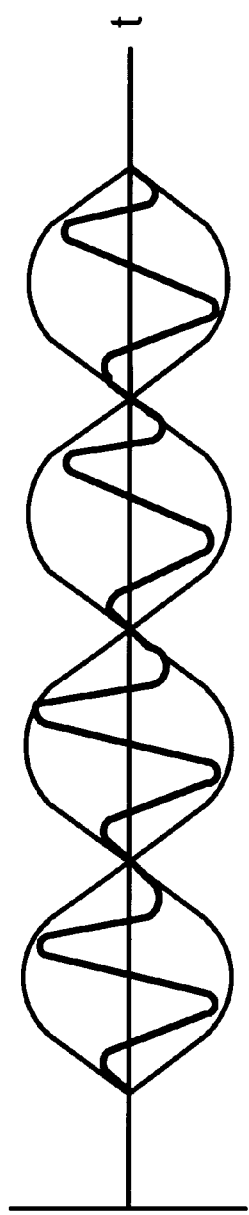
Figure 3E:
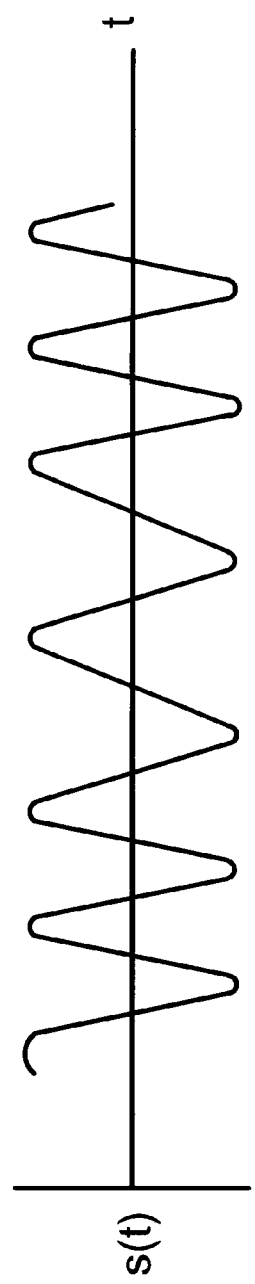
FIG. 3e represents the sum of the waveforms shown in FIGS. 3b and 3d.
Figure 4:
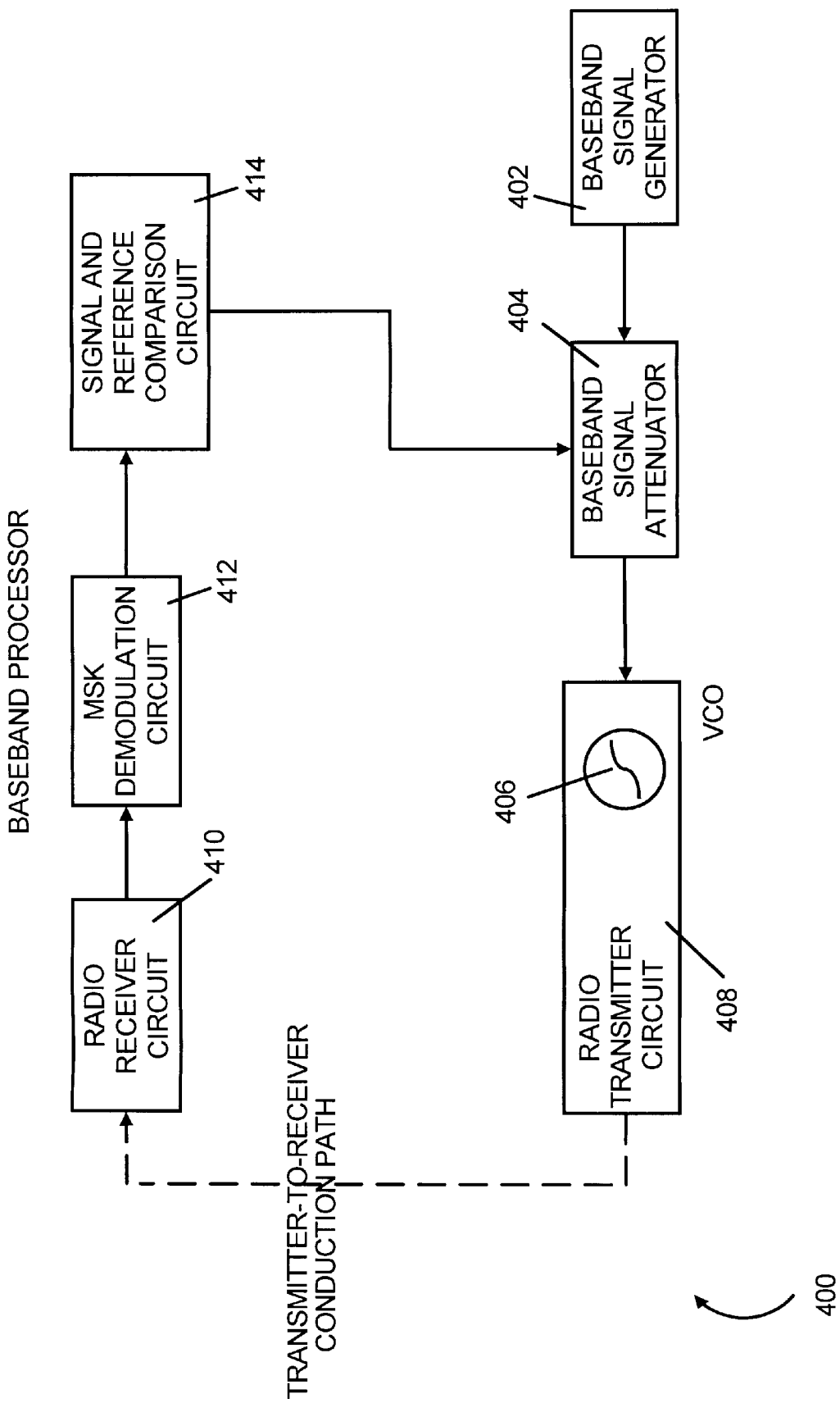
FIG. 4 is a simplified block diagram of a transmitter/receiver in accordance with one embodiment of the present invention.

FIG. 4 is a block diagram of a transmitter/receiver 400 in accordance with the present invention. A baseband signal generator 402 generates a digital signal that represents a data stream to be modulated onto the transmit carrier. In accordance with one embodiment of the present invention, the user data is initially in digital form and is modulated onto a radio frequency (RF) carrier by a modulation technique, such as minimum shift keying (MSK). However, in an alternative embodiment of the present invention, the information that is to be transmitted may be in any format, for example an analog signal which directly modulates a carrier frequency. In addition, the information may be frequency modulated on a carrier by any technique. It should be clear that the present invention is used to calibrate a modulation index of a modulator during operation for any purpose in any transmitter/receiver.

In accordance with the preferred embodiment of the present invention, the baseband signal is routed to a baseband amplitude control device 404 that controls the amplitude of the baseband signal. For example, the baseband amplitude control device 404 may be a programmable attenuator or a variable gain amplifier. The baseband amplitude control device 404 adjusts the baseband amplitude in order to compensate for the modulation sensitivity of the particular VCO within the transmitter. Therefore, variations in the modulation sensitivity of a particular VCO with respect to time, temperature, or the variations in the particular components of the VCO, maybe calibrated out by adjusting the gain of the baseband amplitude control device 404. For the purposes of this discussion, it should be understood that gain can be either positive or negative, and thus, the term gain includes the case in which the signal is attenuated as well as the case in which the signal is amplified.

In accordance with the present invention, the proper baseband gain to apply to the baseband signal is determined by applying a calibration baseband signal having a known amplitude to the VCO 406 within the transmitter 408. The VCO 406 responds to the calibration baseband signal by modulating the output frequency an amount which is a function of the modulation sensitivity of the VCO 406. The output from the VCO 406 is then transmitted. It should be understood that intermediate frequency conversion steps may be used. For example, in a heterodyne transmitter, the baseband signal may be modulated to an intermediate frequency (IF) first, and then a further up-conversion may be performed to raise the transmit frequency as desired.

In one embodiment, the transmit signal is selectively coupled back to the receiver 410 during periods when no transmission to or reception from an external device is required or when calibration is determined to be necessary (i.e., a predetermined amount of time after the last calibration occurred). The receiver 410 amplifies the signal and down-converts the signal to IF as appropriate. The received signal is then coupled to a demodulator 412 which recovers the baseband signal. The baseband signal that is recovered by the demodulator 412 should be proportional in amplitude to the baseband signal that was applied to the baseband amplitude control device 404. The received baseband signal is coupled from the demodulator 412 to a Signal and Reference Comparison Circuit (SRCC) 414 in order to determine whether the received signal is at the desired amplitude. This is preferably done by a comparison with the amplitude of the signal that is applied to the baseband amplitude control device 404. If the relationship between the amplitude of the received baseband signal and the baseband signal that was applied to the baseband amplitude control device 404 is not correct, then the gain of the baseband amplitude device 404 is adjusted to calibrate out the error.

It should be understood that the present invention can perform this calibration procedure anytime the receiver and transmitter are not required, as long as the amplitude of the signal applied to the baseband amplitude control device 404 is "known" within the SRCC 414. However, in accordance with one embodiment of the present invention, a calibration baseband signal is generated and coupled to the baseband amplitude control device 404. The calibration baseband signal has a predetermined value which is "known" in the SRCC 414. Therefore, the calibration baseband signal need not be coupled to the SRCC 414. In addition, in accordance with one embodiment of the present invention, the calibration procedure may be performed while the transmitter and receiver are in normal use. In accordance with such an embodiment, the calibration baseband signal is generated at a frequency that is outside the frequency range of signals that are to be received.

Architecture of the Preferred Embodiment of the Present Invention

Figure 5:
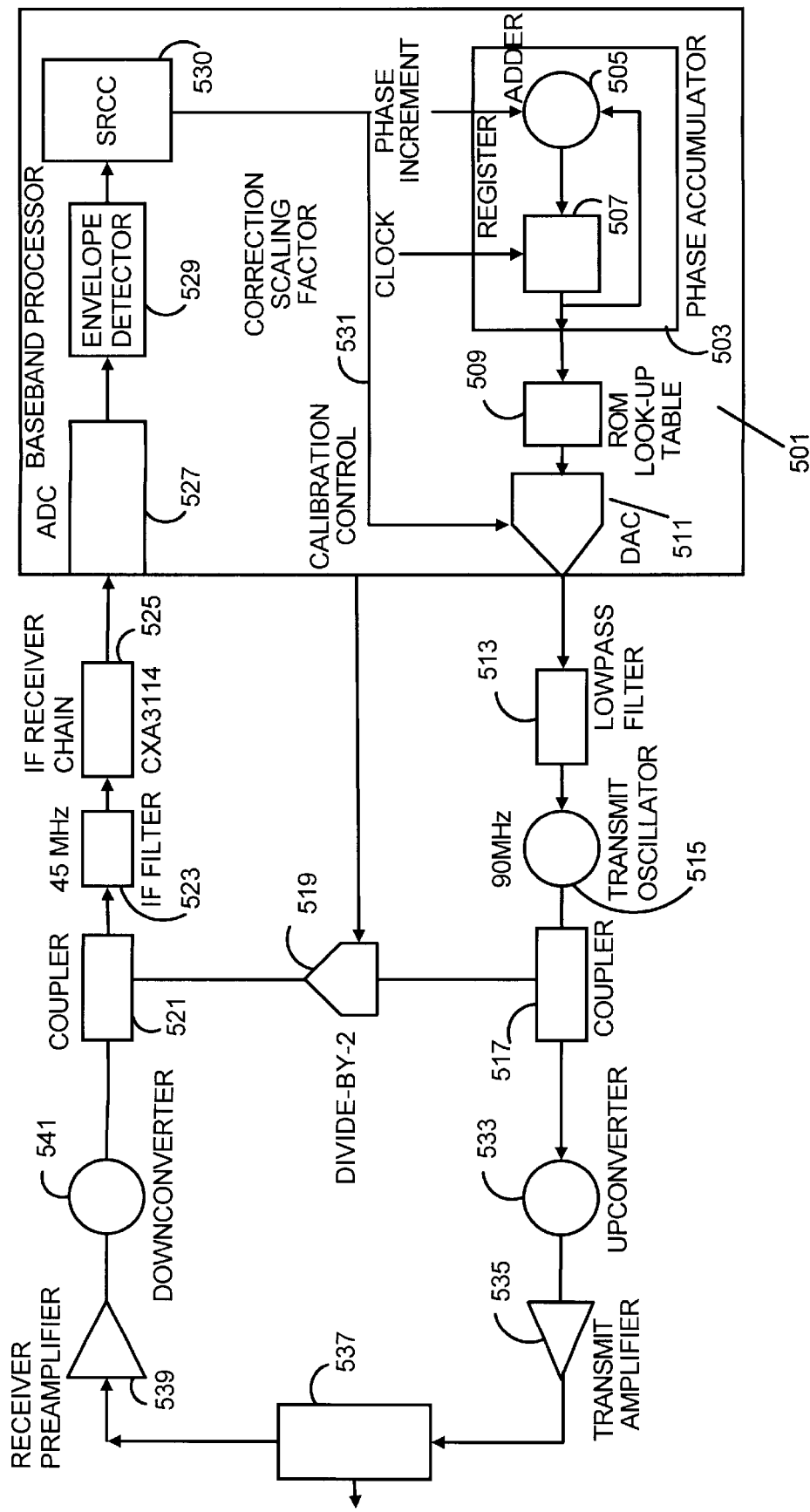
FIG. 5 is a detailed block diagram of one embodiment of the transmitter/receiver in accordance with the present invention.

FIG. 5 is a more detailed block diagram of the architecture of one embodiment of the present invention. In accordance with the embodiment of the present invention that is shown in FIG. 5, a baseband processor 501 comprises a phase accumulator 503, a read-only memory (ROM) look-up table 509, a digital-to-analog converter (DAC) 511, an analog-to-digital converter (ADC) 527, and an envelope detector 529. The phase accumulator includes an adder circuit 505 and a register 507. A phase increment value is applied to one input of the adder circuit 505. Initially, the output from the register will be zero. Therefore, the output from the adder circuit 505 is equal to zero. This value is then stored in the register 507 and output to the ROM look-up table 509. In addition, the output from the register 507 is coupled back to the adder circuit 505. Accordingly, on the next cycle of the register clock, the output from the adder will have been incremented by the amount equal to the phase increment value. The phase increment value determines the rate at which the values stored in the ROM look-up table are output (i.e., the frequency of the waveform which is generated by the DAC 511 in response to the values coupled to the DAC 511 by the ROM look-up table 509). That is, the register 507 outputs a series of digital values that serve as addresses to the ROM look-up table 509. The greater the amount by which these values are incremented, the faster the addresses to the ROM look-up table increment. The ROM lookup table 509 then outputs the stored digital values to the DAC 511. The DAC 511 converts the values to analog voltages and thus outputs an analog wave form which closely approximates a sinusoid. In accordance with one embodiment of the present invention, the DAC output is a sinusoid with a frequency of approximately 1 kHz.

The output from the DAC 511 is applied to a low pass filter 513 that smooths the output to better approximate a pure sinusoid. The sinusoidal signal that is output from the filter 513 is applied to a transmit VCO 515. In accordance with the embodiment shown in FIG. 5, the transmit VCO 515 operates at a center frequency of approximately 90 MHz. The output from the transmit VCO 515 is modulated by the output from the filter 513. The deviation of the VCO 515 depends upon the modulation sensitivity of the particular VCO 515 and the amplitude of the signal coupled to the VCO 515 from the filter 513.

The output from the transmit VCO 515 is coupled to a coupler 517. The transmit coupler 517 couples a portion of the signal to a divide-by-two circuit 519. A calibration control signal is also coupled to the divide-by-two circuit 519. The calibration control signal controls the output from the divide-by-two circuit 519. Accordingly, the transmit signal may be selectively coupled to the receiver. The output from the divide-by-two circuit 519 has a frequency that is half of the frequency of the signal output from the VCO 515. A receive coupler 521 couples the output from the divide-by-two circuit 519 to a receiver intermediate frequency (IF) filter 523. Since the transmit signal in the embodiment shown in FIG. 5 has a frequency of 90 MHz, the IF filter 523 has a center frequency of 45 MHz (i.e., half the frequency of the transmit signal). The output from the IF filter is coupled to an IF receiver chain 525 (such as part no. CXA3114 manufactured by Sony Corporation) which demodulates the output from the IF filter 523. The output from the IF receiver 525 is an analog voltage. The analog voltage output from the IF receiver 525 is coupled to the ADC 527.

The ADC 527 converts the output from the IF receiver 525 to digital data. The envelope detector 529 determines the highest and lowest values output from the ADC 527. The envelope detector is coupled to a Signal and Reference Comparison Circuit (SRCC) 530. The difference between the highest and lowest values represent the peak-to-peak value of the received baseband signal. Since the deviation of the transmit signal was divided by two, the peak-to-peak value of the received baseband signal is multiplied by two by the SRCC 530 in order to determine the actual deviation of the transmit signal and hence the actual sensitivity of the transmit VCO 513. By comparing the corrected value of the peak-to-peak receive baseband signal with a desired peak-to-peak value (i.e., the peak-to-peak value that would be received if the modulation sensitivity of the transmit VCO 513 were ideal) a correction scaling factor is calculated by the SRCC 530. This correction scaling factor is then coupled to the DAC 511 over signal line 531 to correct the DAC output such that the resulting DAC error cancels out the transmit VCO sensitivity error. For example, the output from the DAC can be multiplied by the correction scaling factor to correct for the transmit VCO sensitivity error.

The transmit coupler 517, in addition to being coupled to the divide-by-two circuit 519, is also coupled to an up-converter 533. The up-converter 533 is coupled to a transmit amplifier 535. The transmit amplifier is coupled to an antenna 537. The antenna 537 both transmits and receives. The output from the antenna 537 is coupled to a receiver preamplifier 359. The receiver preamplifier is coupled to a down-converter 541. Accordingly, the present invention can calibrate the modulation sensitivity of the transmitter intermittently between normal transmission and reception. By dynamically adjusting the correction scaling factor, changes in the modulation sensitivity of the transmit VCO 515 can be accounted for and corrected virtually in real-time. The ability to correct for changes in the modulation sensitivity while the transmitter is in use makes it possible to use modulation techniques that require very accurate control over the modulation index of the transmit signals, such as MSK modulation with modulators that are relatively inexpensive and which have a modulation sensitivity that changes over time and temperature.

Figure 6:
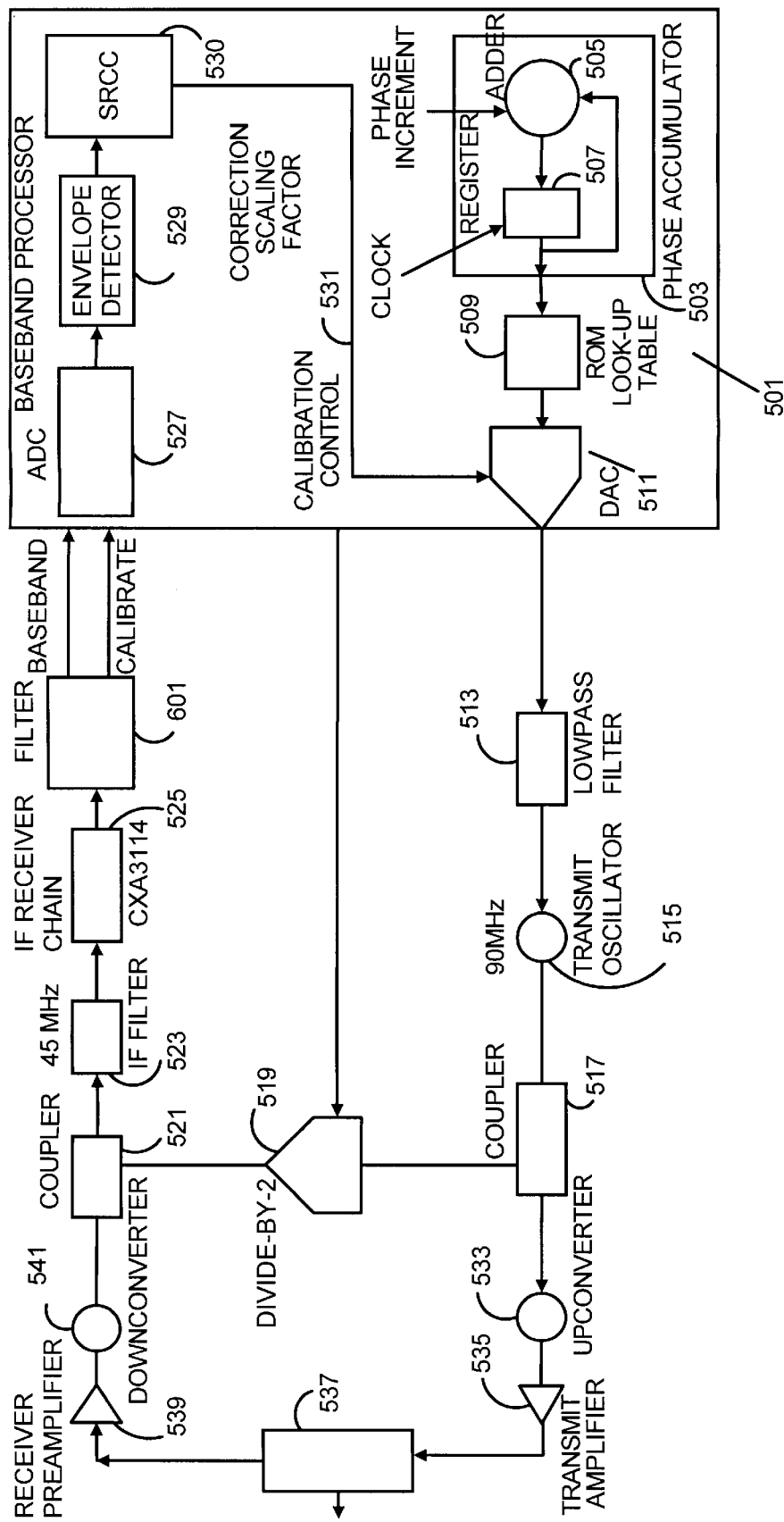
FIG. 6 is a detailed block diagram of another embodiment of the transmitter/receiver in accordance with the present invention in which a filter separates the calibration baseband signal from baseband signals that are received from external sources.

In accordance with one embodiment of the present invention shown in FIG. 6, the calibration baseband signal is generated at a frequency that is distinct from the frequency of the baseband signal that is transmitted from sources external to the inventive system and received by the inventive system during normal operations. A filter 601 is provided which separates the calibration baseband signal from the baseband signal that is received from external sources. Both the calibration baseband signal and the baseband signal that is received from external sources are coupled to the ADC 527. In this way, a calibration procedure may be performed during normal reception of signals from external sources.

In accordance with one embodiment of the present invention, a digital signal processor or other such programmable device performs all of the functions described above as being performed by the components in the baseband processor 501. Alternatively, the baseband processor 501 includes discrete devices, an application specific integrated circuit (ASIC), or combinations of components which perform the functions described above. It should be clear to those skilled in the art that the any particular manner can be used to modulate and demodulate the signals and that any manner can be used to generate the baseband signal to be coupled from the transmitter to the receiver.

Summary

A number of embodiments of the present invention have been described. Nevertheless, it will be understood that various modifications may be made without departing from the spirit and scope of the invention. For example, while the above description of the present invention refers to digital methods for generating the baseband signal and for comparing the received baseband signal with the desired baseband signal, analog techniques can be used. That is, the amplitude of the baseband signal may be directly determined without the need to convert the baseband analog signal into a digital signal prior to determining the ratio of the peak-to-peak amplitude of the received signal to the desired peak-to-peak amplitude. In addition, the relationship between the received baseband signal and the baseband signal that is coupled to the transmit VCO depends upon the relationship between the center frequency of the output of the transmit VCO and the frequency of the signal that is demodulated in the receiver to recover the baseband signal. For example, in the embodiment shown in FIG. 5, the transmit VCO 515 has a center frequency of 90 MHz. The center frequency of the signal that is being demodulated in the receiver is half that (i.e., 45 MHz). Therefore, since the ratio of the center frequency of the transmit VCO 515 to the center frequency of the signal that is demodulated in the receiver is 2:1, the ratio of the amplitude of the transmit baseband signal to the received baseband signal should be 2:1 if the modulator sensitivity error has been corrected. However, in an alternative embodiment of the present invention, this relationship can differ significantly by changing the ratio of the transmit VCO frequency to the receive frequency to be demodulated.

Accordingly, it is to be understood that the invention is not to be limited by the specific illustrated embodiments, but only by the scope of the appended claims.

What is claimed is:

1. A method for calibrating modulation sensitivity of a modulator in a transceiver having a transmit channel and a receive channel, including the steps of:

(a) generating a transmit baseband signal of a known amplitude with a digital synthesizer of the transmit channel;

(b) modulating the output of a voltage controlled oscillator with the transmit baseband signal;

(c) selectively coupling the output from the voltage controlled oscillator to the receive channel;

(d) demodulating the receive channel signal and determining the deviation of the receive channel signal from the known amplitude baseband signal; and (e) calculating a modulation sensitivity correction scaling factor and applying it to the digital synthesizer.

2. The method of claim 1, wherein the step of generating the transmit baseband signal includes generating a calibration baseband signal at a frequency that differs from the frequency of baseband signals received from external sources.

3. The method of claim 1, further including the steps of:

(a) determining whether the receive channel and transmit channel are in use; and (b) selectively coupling the output from the voltage controlled oscillator to the receive channel only if the receive channel and transmit channel are determined not in use.

4. A method for calibrating modulation sensitivity of a modulator in a transceiver having a transmit channel and a receive channel, including the steps of:

(a) determining that more than a predetermined amount of time has elapsed since the last time the modulation sensitivity of the modulator has been calibrated;

(b) generating a transmit baseband signal of a known amplitude with a digital synthesizer of the transmit channel;

(c) modulating the output of a voltage controlled oscillator with the transmit baseband signal;

(d) selectively coupling the output from the voltage controlled oscillator to the receive channel;

(e) demodulating the receive channel signal; and (f) calculating a modulation sensitivity correction scaling factor and applying it to the digital synthesizer.

5. A transceiver having a transmit channel and a receive channel, the transceiver comprising:

(a) a digital synthesizer that generates a cyclic baseband signal having a known amplitude;

(b) a voltage controlled oscillator of the transmit channel that produces a transmit signal of a desired baseband amplitude;

(c) a switch that selectively couples the transmit signal to the receive channel;

(d) a demodulator that receives the transmit signal and demodulates it, producing a receive channel signal; and (e) a signal and reference comparison circuit that receives the receive channel signal from the demodulator, determines the deviation of the receive channel signal from the known amplitude baseband signal, and calculates a modulation sensitivity correction scaling factor that it applies to the digital synthesizer.

6. A transceiver as defined in claim 5, wherein the frequency of the baseband signal differs from the frequency of any receive channel signal received from an external source.

7. A transceiver as defined in claim 5, wherein the switch selectively couples the transmit signal to the receive channel only if the receive channel and transmit channel are not in use.

* * * * *